US 6,549,393 B2

United States Patent
Kanno et al.

(10) Patent No.: US 6,549,393 B2
(45) Date of Patent: Apr. 15, 2003

(54) SEMICONDUCTOR WAFER PROCESSING APPARATUS AND METHOD

(75) Inventors: Seiichiro Kanno, Chiyoda (JP); Hironobu Kawahara, Kudamatsu (JP); Mitsuru Suehiro, Kudamatsu (JP); Saburo Kanai, Hikari (JP); Ken Yoshioka, Hikari (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/946,615

(22) Filed: Sep. 6, 2001

(65) Prior Publication Data
US 2003/0030960 A1 Feb. 13, 2003

(30) Foreign Application Priority Data
Aug. 13, 2001 (JP) .......................... 2001-245516

(51) Int. Cl.[7] .............................................. H02N 13/00
(52) U.S. Cl. ...................................... 361/234; 361/220
(58) Field of Search ........................ 361/234, 115, 361/103, 212, 220

(56) References Cited

U.S. PATENT DOCUMENTS

| | | | | |
|---|---|---|---|---|
| 5,460,684 A | * | 10/1995 | Saeki et al. ............ | 156/345.51 |
| 5,478,429 A | * | 12/1995 | Komino et al. ......... | 156/345.44 |
| 5,529,657 A | * | 6/1996 | Ishii ...................... | 156/345.26 |
| 5,581,874 A | * | 12/1996 | Aoki et al. .................... | 29/458 |
| 5,835,334 A | * | 11/1998 | McMillin et al. ........... | 361/234 |
| 6,310,755 B1 | * | 10/2001 | Kholodenko et al. ....... | 361/234 |
| 6,373,681 B2 | * | 4/2002 | Kanno et al. ............... | 361/234 |

* cited by examiner

Primary Examiner—Stephen W. Jackson
(74) Attorney, Agent, or Firm—Antonelli, Terry, Stout & Kraus, LLP

(57) ABSTRACT

A wafer stage 2 for holding a semiconductor wafer in a plasma treatment apparatus by setting the wafer on the wafer stage, said wafer stage 2 comprising a base material 26 equipped with refrigerant flow paths for allowing a refrigerant for temperature adjustment to flow; a stress-reducing member 28 provided on the wafer setting side of said base material 26 and having a smaller thermal expansion coefficient than does said base material; a dielectric film 30 provided on the wafer setting side of said stress-reducing member; and a deflection-preventing member 29 provided on the wafer non-setting side of said base material and having a smaller thermal expansion coefficient than does said base material. When the wafer stage is used, the temperature of the wafer as a substrate to be processed can be controlled uniformly and very accurately.

8 Claims, 13 Drawing Sheets

SEMICONDUCTOR WAFER PROCESSING APPARATUS AND METHOD

BACKGROUND OF THE INVENTION

This invention relates to a wafer stage and a processing apparatus and a processing method which use the wafer stage. In particular, it relates to, for example, the wafer stage which permits uniform and very accurate control of the temperature of a wafer as a substrate to be processed.

In recent years, circuit patterns have become finer steadily with an enhancement of the degree of integration of semiconductor devices, so that the dimensional accuracy in fabrication has required to become higher and higher. In such a situation, it is very important to control the temperature of a wafer under processing.

For example, in an etching process that is required to give a high aspect ratio, etching is conducted while protecting the sidewall with an organic polymer in order to realize anisotropic etching. In the process, the production of the organic polymer as a protective film changes with temperature. Therefore, if the temperature distribution of a wafer under processing is not uniform, the thickness of the sidewall protective film produced is not uniform depending on a position on the wafer surface, so that the shape of etched portion is not uniform.

In recent semiconductor production processes, the diameter of a wafer is increased in order to reduce the production cost, and the heat input to the wafer tends to be increased more and more. Therefore, controlling the temperature of the wafer surface uniformly is a very important technical problem. For example, in a process of etching an interlaminar insulating film in a processing line in which the diameter of a wafer is 300 mm, a bias electric power applied to the wafer reaches about 3 kW and the wafer is heated by this electric power.

The wafer under plasma treatment in the above-mentioned production process is electrostatically attracted and held on a stage by means of an electrostatic chuck. The aforesaid wafer is cooled by introducing a thermally conductive gas (usually, helium) into the space between the wafer and the stage.

The structure of the electrostatic chuck is varied depending on the specifications of each apparatus. In general, the structure is such that a ceramic film of about 1 mm or less in thickness is attached to the surface of a metal good in thermal conduction used as a base, such as aluminum. Refrigerant flow paths are provided in the base metal, and the electrostatic chuck is cooled by allowing a refrigerant whose temperature is controlled by means of a thermoregulator provided outside the apparatus, to flow along the aforesaid flow paths.

The permissible temperature range of a wafer to be controlled varies depending on a process. For example, the temperature of a stage for holding the wafer is required to be stable in a wide temperature range from a low temperature of about −40° C. to a high temperature of about 100° C. That is, the wafer stage of a plasma treatment apparatus is required to realize a uniform temperature distribution in a wide temperature range on the whole surface of a wafer having a large diameter, even at a high heat input.

However, in a stage having such a structure as is described above, the thermal expansion coefficients of the base metal and the dielectric film are widely different. Therefore, no problem is caused when the working temperature is approximately 20° C. to 40° C. However, in a temperature range of 80° C. to 100° C., a high thermal stress is generated in the dielectric film owing to the difference between the thermal expansion coefficients of the base metal and the dielectric film, so that the film is broken in some cases. In this case, the stage should be replaced after stopping an apparatus.

JP-A-11-176919 discloses a wafer stage capable of solving the above problem. In the apparatus disclosed therein, a ceramic sintered product is attached to a composite material of aluminum and a ceramic by brazing; an electroconductive brazing material or a metal with a thermal expansion coefficient close to that of a dielectric film, such as titanium or molybdenum is embedded as the electrode of an electrostatic chuck in the ceramic sintered product; and a dielectric layer is formed on the surface of the ceramic sintered product.

FIG. 12 is a diagram showing a plasma treatment apparatus using another conventional wafer stage, and FIG. 13 is an enlarged view of the wafer stage shown in FIG. 12.

First, an etching gas 11 is introduced into a vacuum chamber 9, and the pressure inside the vacuum chamber 9 is maintained at a suitable pressure by adjusting the opening of a valve 12 provided upstream to a turbo-molecular pump 13. A parallel-plate upper electrode 10 is located over a wafer stage 2 in the vacuum chamber 9. Plasma 6 is generated in the vacuum chamber by applying a high-frequency voltage of 13.56 MHz to the upper electrode 10 by using a high-frequency power source 8.

Etching can be conducted by exposing a wafer 1 to the plasma. The wafer is set on the wafer stage 2 located so as to face the upper electrode. The wafer stage 2 is fixed on an insulating member 7 fixed on a flange 5, by means of bolts 19, and is electrically insulated from the vacuum chamber 9. The wafer stage 2 is such that a 1-mm thick dielectric film 21 composed mainly of a ceramic is attached to the surface of a base material 17 made of aluminum, by flame spraying or the like.

A through-hole 14 for introducing helium gas is provided in the center of the wafer stage. The flow rate of the gas introduced can be adjusted by controlling a flow rate regulator 25 on the basis of a value measured with a pressure gage 24 attached to a gas piping 23 under the reverse side of the wafer.

In the peripheral portion of the wafer stage, twelve bolt holes for fixing on the insulating member are provided in the peripheral direction. On the reverse side of the base material, refrigerant grooves are provided in concentric circles. The above-mentioned flange 5 is fixed on the vacuum chamber 9 by means of bolts 4. An O-ring 3 prevents a refrigerant for cooling the wafer stage from leaking into the treatment chamber.

The wafer stage 2 is connected to an external high-frequency power source 20 while being electrically insulated from the flange by an insulating material 18. For example, a high-frequency bias voltage of 800 kHz is applied to the wafer stage 2. Thus, a bias voltage is generated in the wafer, so that ions can be effectively introduced into the wafer. Accordingly, the etching capability can be improved: for example, anisotropic etching can be realized, and the etching rate can be increased.

However, in the method described above, the ions heat the wafer simultaneously with their introduction into the wafer. Therefore, the wafer should be externally cooled. The wafer stage 2 can be cooled by circulating a refrigerant controlled at a definite temperature, from a refrigerator provided outside the vacuum chamber 9, to the refrigerant grooves 15 provided in the base material 17. However, under usual etching conditions, the pressure inside the treatment chamber is some pascals. Since the pressure is low, the thermal resistance between the wafer and the wafer stage is high, so that the wafer cannot be sufficiently cooled. Therefore, the cooling efficiency is usually improved by introducing an inert and thermally conductive gas such as helium gas into the space between the wafer and the wafer stage. Usually, the pressure of the gas is approximately 500 Pa to 2 kPa. In order to prevent the wafer from moving to a position different from that of the wafer stage owing to the gas pressure, the wafer is electrostatically attracted on the wafer stage by applying a direct-current voltage to the wafer stage from a direct-current power source 22. The wafer is substantially at earth potential because it is in contact with the plasma. Therefore, a potential difference is made in the dielectric film 21 between the wafer and the wafer stage owing to the direct-current power source 22, and the wafer is electrostatically attracted by Coulomb's force of electric charges due to said potential difference.

SUMMARY OF THE INVENTION

In the apparatus according to the above reference JP-A-11-176919, the composite material of aluminum and a ceramic is used as a base material because a sintered ceramic for reducing a stress between the dielectric layer and the base material is provided on the base material as described above. Such a composite material, however, usually costs more than aluminum. In addition, since the aforesaid ceramic used as a stress-reducing layer is an insulating material, an electric connector should be provided between the electrode layer and the base material, resulting in a complicated structure. Moreover, the aforesaid ceramic becomes a thermal resistance, so that the controllability of the temperature of a wafer is deteriorated.

FIG. 14 and FIG. 15 are graphs showing the temperature distribution on the surface of a wafer (diameter: 8 inches) and the stress distribution on the surface of the dielectric film, respectively, in the above-mentioned conventional plasma treatment apparatus (heat input: 200 W).

A bias electric power of 200 W is input to the wafer stage, and the temperature of the refrigerant circulated in the wafer stage is controlled at 20° C. In this case, the temperature difference on the wafer surface was about 9° C., and the maximum principal stress generated in the dielectric film was about 6 kgf/mm$^2$ or less. The cause of the stress generation in the dielectric film is the difference between the thermal expansion coefficients of aluminum as the base material and the ceramic as the dielectric film. In calculating the stress, it was assumed that the thermal expansion coefficient of aluminum is 23×10$^{-6}$ (1/K) and that of the ceramic 10×10$^{-6}$ (1/K). When the temperature difference on the wafer surface and the stress are values shown in the figures, the treatment can be carried out without deterioration of etching characteristics and breakage of the dielectric film.

In recent years, increasing the bias electric power to about 1 kW has come to be required for further increasing the etching rate. In addition, the temperature of the wafer stage is required to be adjusted to a high temperature of approximately 80° C. to 100° C. or a low temperature of approximately −40° C. to 0° C. in some cases, depending on a process. When the treatment is carried out under such conditions, the temperature distribution on the wafer surface is deteriorated and moreover, a high stress is generated in the dielectric film, so that the dielectric film is liable to be broken.

FIG. 16 and FIG. 17 are graphs showing the temperature distribution on the surface of a wafer (diameter: 8 inches) and the stress distribution on the surface of the dielectric film, respectively, in the above-mentioned conventional plasma treatment apparatus (heat input: 1 KW).

A bias electric power of 1 KW is input to the wafer stage, and the temperature of the refrigerant circulated in the wafer stage is controlled at 20° C. In this case, the temperature of the wafer in the vicinity of its periphery is higher than that in the vicinity of the center, and there is a temperature difference of about 46° C. on the wafer surface. In such a situation, etching characteristics are not uniform because those in the center of the wafer are different from those in the vicinity of the periphery. Consequently, the product performance characteristics finally attained are not uniform and the yield is decreased. In order to prevent the rise of temperature of the wafer in the vicinity of its periphery, providing of refrigerant grooves also in the vicinity of the periphery is thought of. However, in the case shown in FIGS. 16 and 17, the O-ring 3 for preventing the leakage of the refrigerant is necessary in the peripheral portion, so that it is substantially impossible to provide refrigerant grooves in the peripheral portion.

FIG. 17 shows the distribution of maximum principal stress on the surface of the dielectric film which was calculated by raising the refrigerant temperature in 20° C. steps from 0° C. to 80° C. As shown in FIG. 17, the maximum principal stress increase with a rise of the refrigerant temperature and exceeds 20 kgf/mm$^2$ at 80° C.

According to our experiences, the dielectric film tends to be cracked at a stress of more than 20 kgf/mm$^2$ though the cracking depends on a method for attaching the dielectric film to the wafer stage. If the dielectric film is cracked, the attraction of the wafer becomes impossible.

The present invention was made in view of problems described above and provides a wafer stage which permits uniform and very accurate control of the temperature of a wafer as a substrate to be processed.

In order to solve the above problems, the following means was employed in the present invention.

A wafer stage for holding a semiconductor wafer in a plasma treatment apparatus by setting the wafer on the wafer stage, said wafer stage comprising a base material equipped with refrigerant flow paths for allowing a refrigerant for temperature adjustment to flow; a stress-reducing member provided on the wafer setting side of said base material and having a smaller thermal expansion coefficient than does said base material; a dielectric film provided on the wafer setting side of said stress-reducing member; and a deflection-preventing member provided on the wafer non-setting side of said base material and having a smaller thermal expansion coefficient than does said base material.

DETAILED DESCRIPTION OF THE INVENTION

Figure 1:
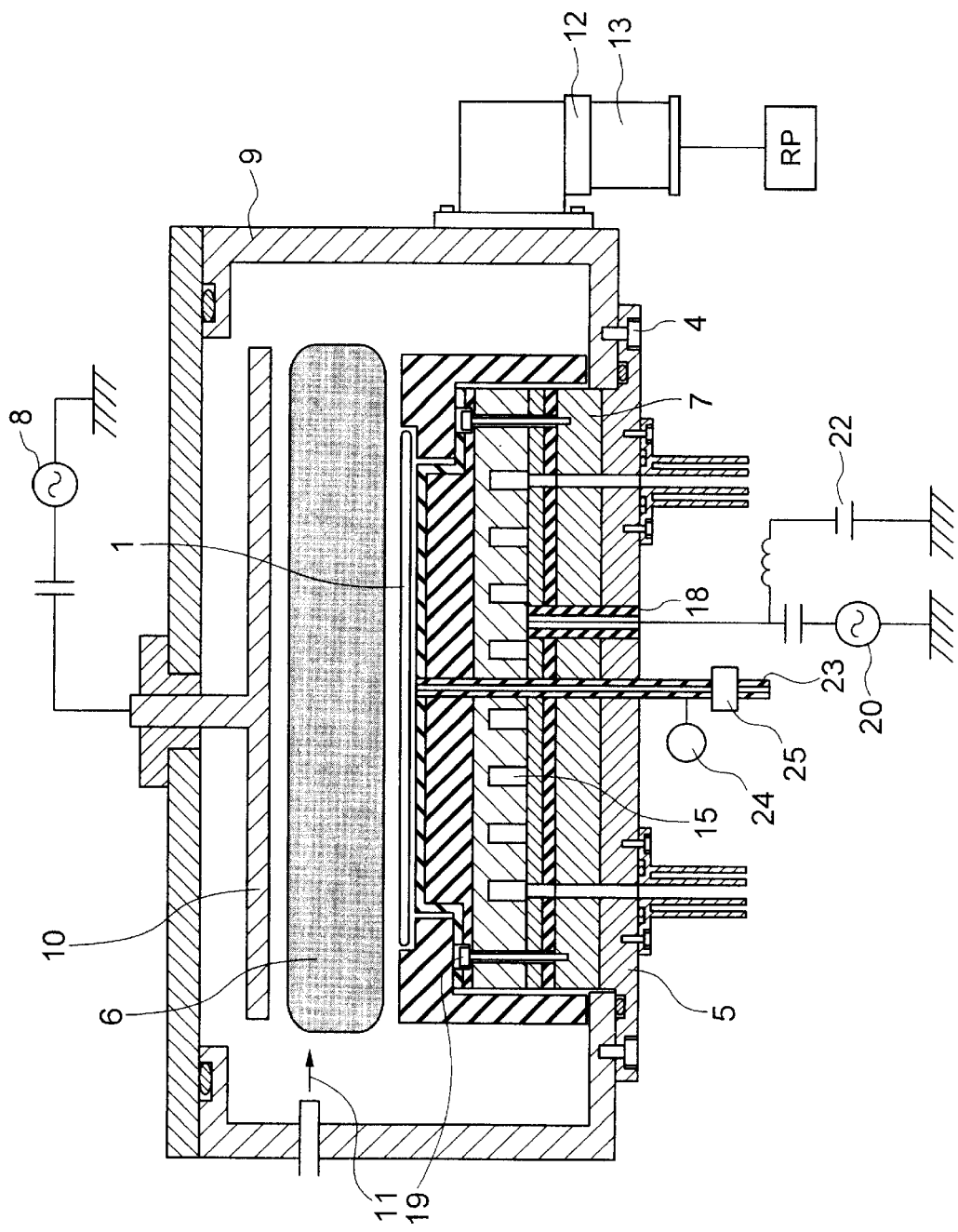
FIG. 1 is a diagram showing a wafer processing apparatus equipped with a wafer stage according to a first embodiment of the present invention.
Figure 2:
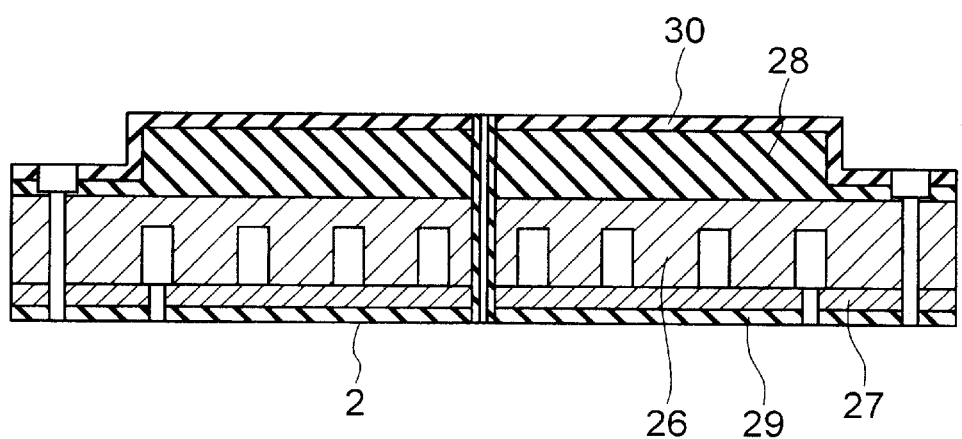
FIG. 2 is an enlarged view of the wafer stage.
Figure 12:
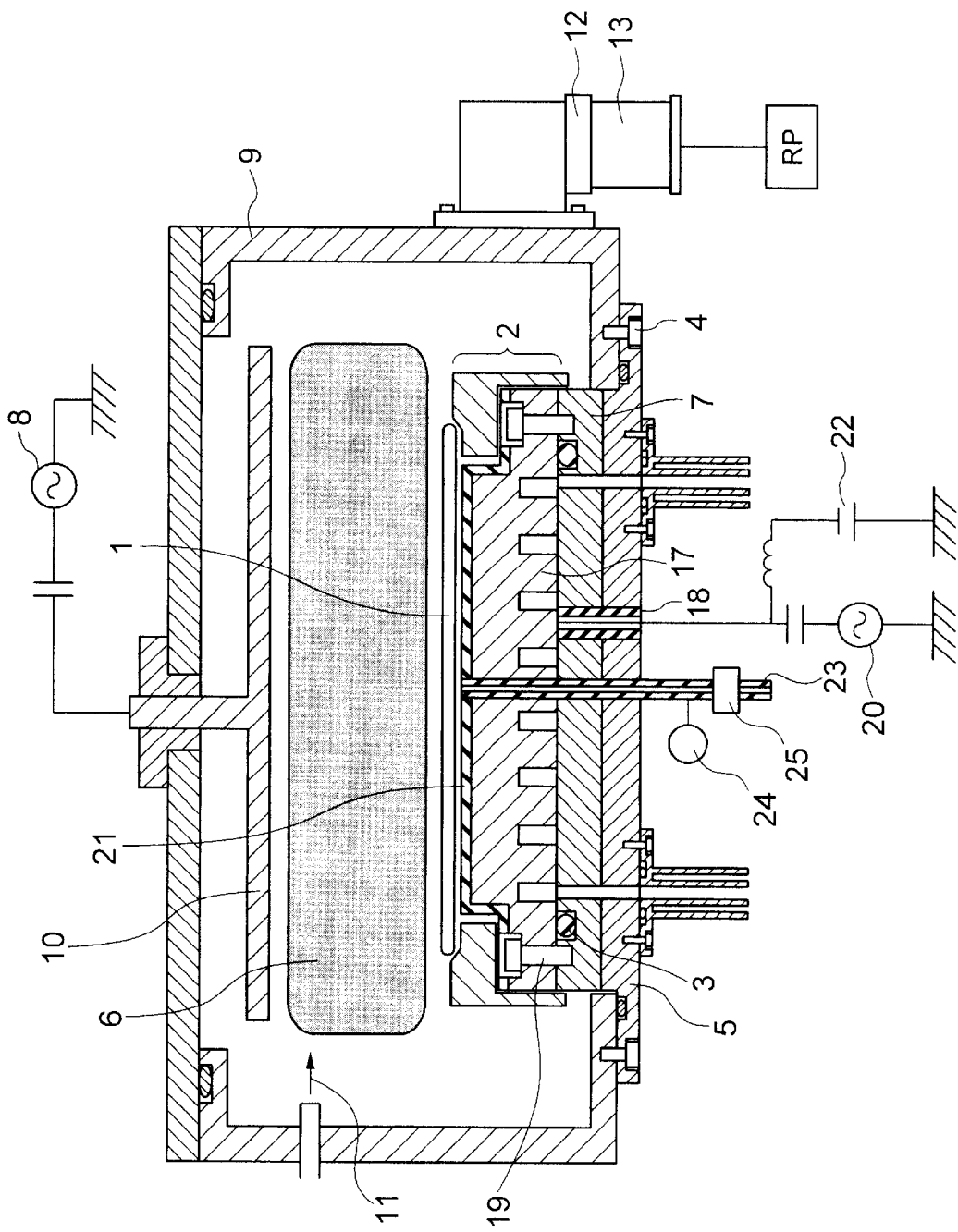
FIG. 12 is a diagram showing a plasma treatment apparatus using a conventional wafer stage.
Figure 13:
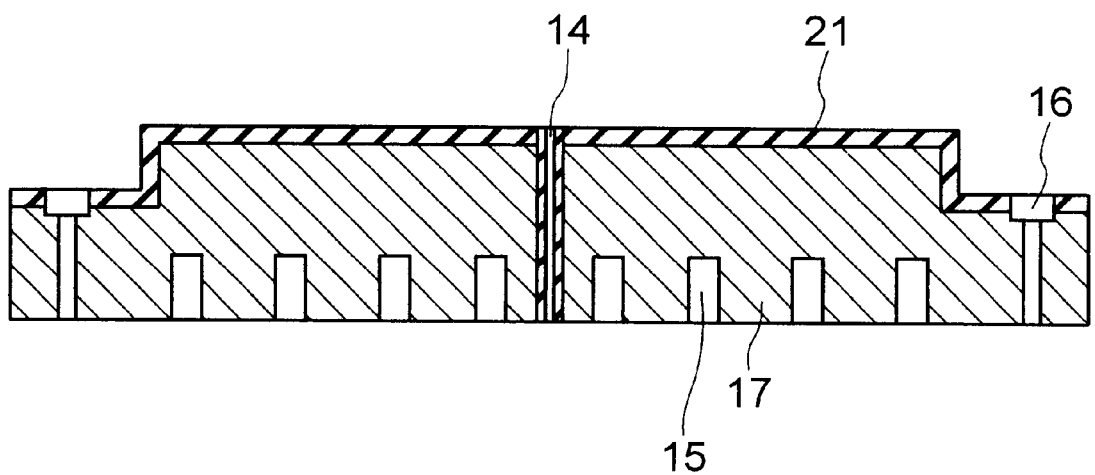
FIG. 13 is an enlarged view of the wafer stage portion.
Figure 14:
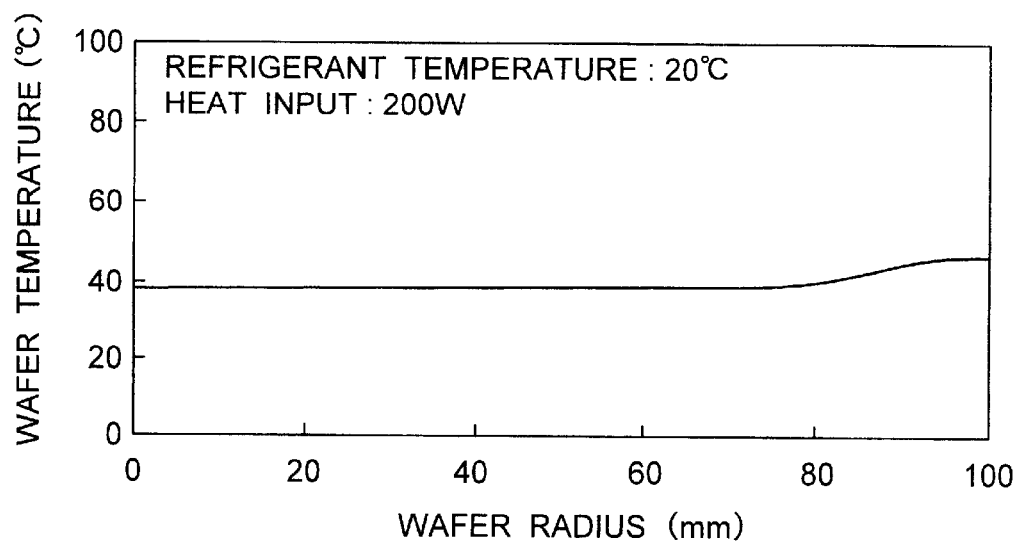
FIG. 14 is a graph showing the temperature distribution on the surface of a wafer in a conventional plasma treatment apparatus.
Figure 15:
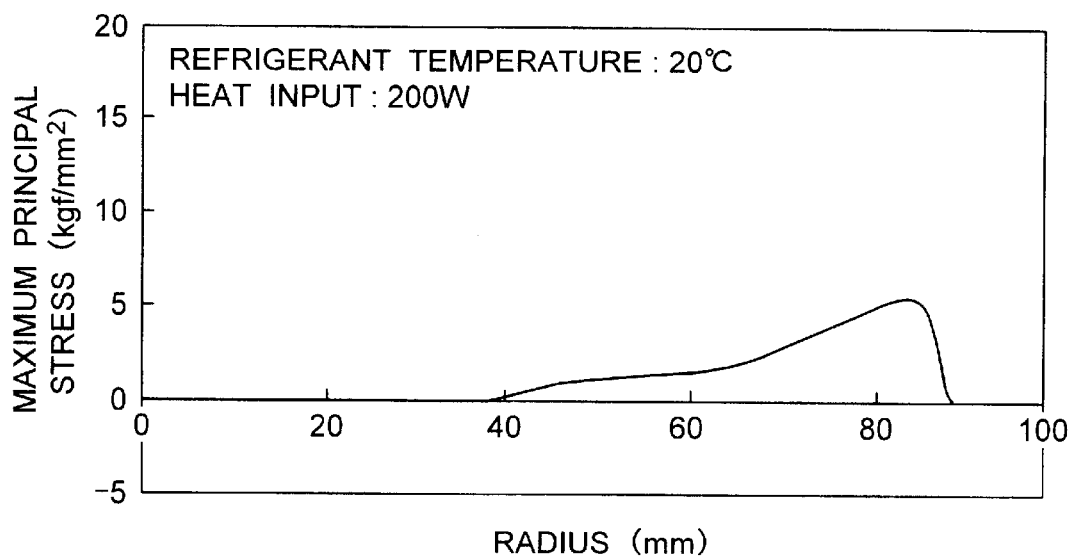
FIG. 15 is a graph showing the stress distribution on the surface of the dielectric film in the conventional plasma treatment apparatus.
Figure 16:
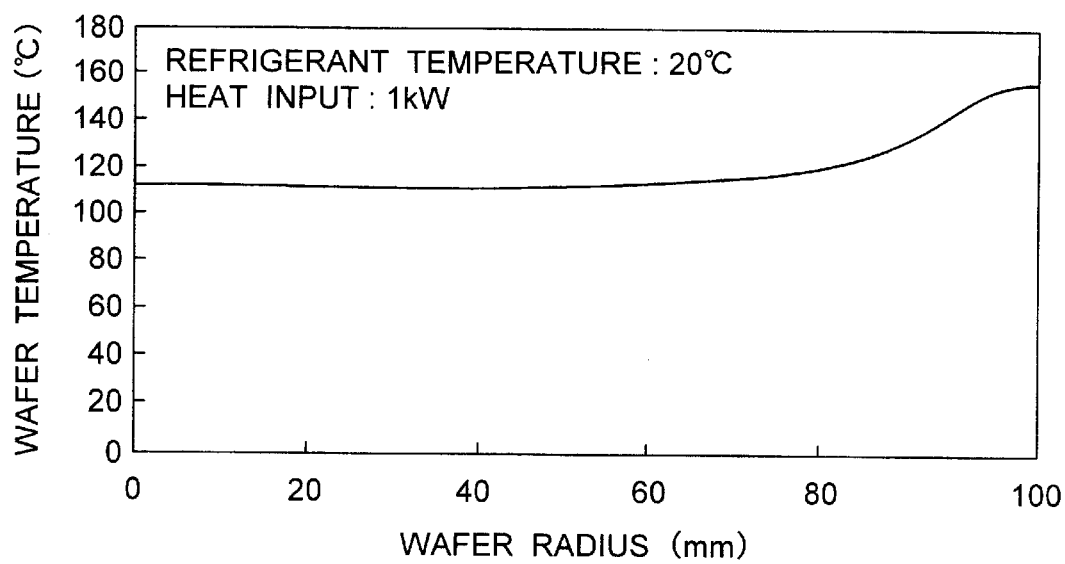
FIG. 16 is a graph showing the temperature distribution on the surface of a wafer in the conventional plasma treatment apparatus.
Figure 17:
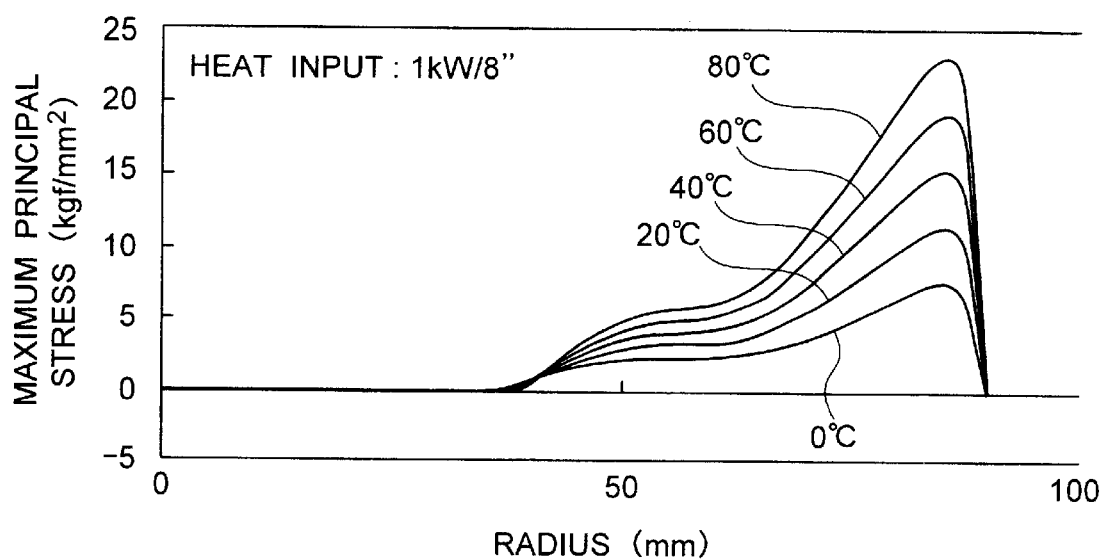
FIG. 17 is a graph showing the stress distribution on the surface of the dielectric film in the conventional plasma treatment apparatus.

The embodiments of the present invention are explained below with reference to the attached drawings. FIG. 1 is a diagram showing a plasma treatment apparatus equipped with a wafer stage according to a first embodiment of the present invention. FIG. 2 is an enlarged view of the wafer stage portion. In these figures, explanation of the same parts as shown in FIG. 12 and FIG. 13 is omitted by expressing these parts by the same symbols, respectively, as in FIG. 12 and FIG. 13. In the present embodiment, an aluminum plate 27 is brazed to the under surface of a base material 26 having refrigerant grooves formed therein. When such a structure is employed, an O-ring for preventing the leakage of a refrigerant is unnecessary, so that the refrigerant grooves can be also in the closer vicinity of the periphery. Therefore, the temperature distribution on the surface of a wafer can be made more uniform by keeping the temperature of the wafer in the vicinity of its periphery low.

A stress-reducing member 28 made of titanium is brazed to the top surface of the base material, and a ceramic dielectric film 30 of 1 mm in thickness is attached to the stress-reducing member by flame spraying. Thus, it becomes possible to prevent the generation of a high stress which is caused in the dielectric film when a high-temperature refrigerant is allowed to flow.

A deflection-preventing member 29 made of titanium is also brazed to the under surface of the base material through the aluminum plate 27. Thus, it becomes possible to prevent warping caused by the difference in stiffness between the base material and the stress-relaxing member.

In the present embodiment, the stress-reducing member to which the dielectric film is attached has a thermal expansion coefficient of $8.6 \times 10^{-6}$ (1/K) which is smaller than that of the aluminum base material and is close to that of the dielectric film $10 \times 10^{-6}$ (1/K). Therefore, a film stress generated in the dielectric film can be reduced, so that the wafer stage can be used even in a process practiced at a higher temperature.

Figure 3:
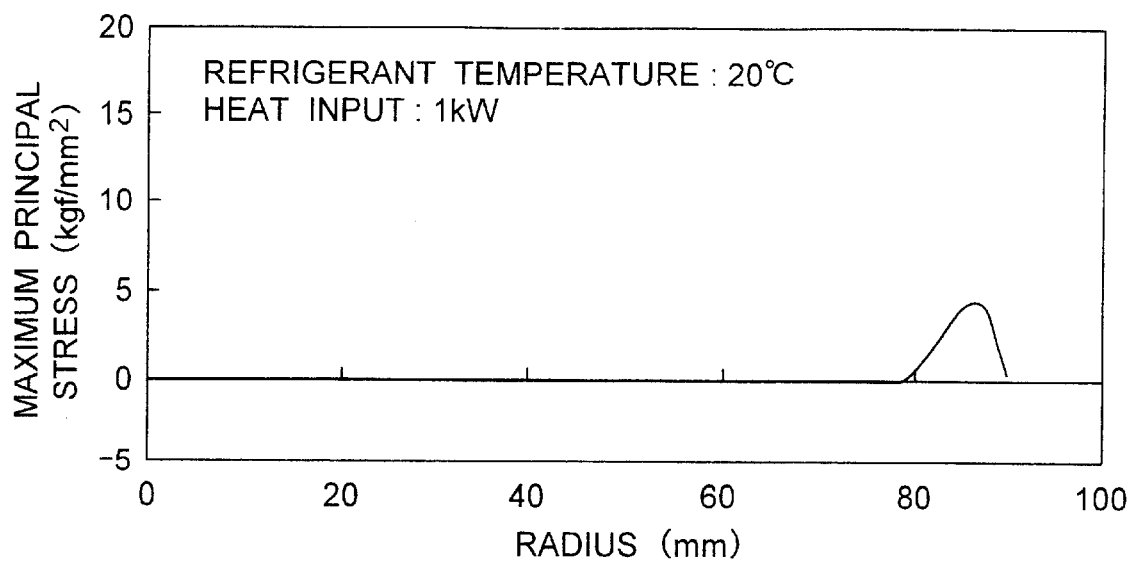
FIG. 3 is a graph showing the stress distribution of the dielectric film of the wafer stage.

FIG. 3 is a graph showing the stress distribution of the dielectric film of the wafer stage in the present embodiment. As shown in FIG. 3, a stress generated in the dielectric film is reduced to about 5 kgf/mm$^2$ from a conventional value of more than 20 kgf/mm$^2$. At the reduced stress value, the film is not cracked. That is, the aforesaid wafer stage can be used in either a high-pressure or low-pressure process.

Although the ceramic film as the dielectric film is attached to the stress-reducing member by flame spraying, a ceramic sintered product may be attached by brazing or with an adhesive. Although the thickness of the dielectric film is 1 mm in the above case, it should be properly determined depending on the pressure of helium and the film properties of the dielectric used. In the present embodiment, a material for the base material having the refrigerant flow paths formed therein is aluminum and a material for the stress-reducing member and the deflection-preventing member is titanium, though a combination of these materials is not limited to the above combination. That is, the following are necessary conditions: the thermal conductivity of the base material having the refrigerant grooves formed therein is larger than that of the stress-reducing member and that of the deflection-preventing member, and the thermal expansion coefficient of the stress-reducing member is close to that of the dielectric film. When these conditions are satisfied, a temperature gradient is hardly given to the base material, so that the uniform temperature distribution of a wafer can be realized. Moreover, a film stress generated in the dielectric film is reduced, resulting in an improved reliability.

Figure 4:
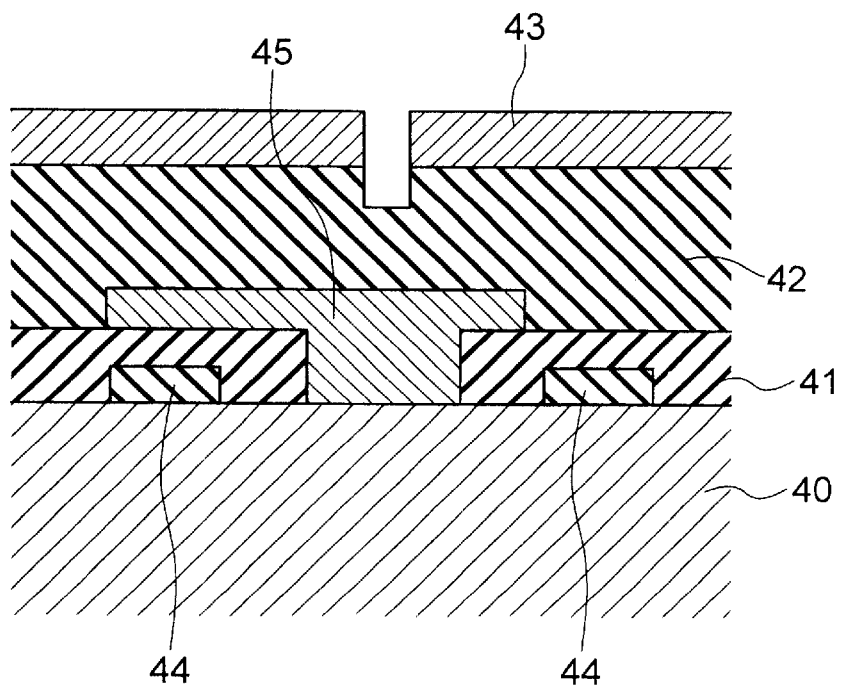
FIG. 4 is a diagram showing a semiconductor device which permits processing using a plasma treatment apparatus.

FIG. 4 is a diagram showing a semiconductor device which permits processing using a plasma treatment apparatus. As shown in FIG. 4, gate electrodes 44, a tungsten (W) wiring 45 and interlaminar insulating films 41 and 42 are formed on a silicon substrate 40. A resist mask 43 is formed on said interlaminar insulating film 42, and perforation for contact with the tungsten (W) wiring 45 is carried out by utilizing the mask. The thickness of the interlaminar insulating film 42 is 2 μm, the diameter of each hole formed in said film is 0.3 μm, and the perforation is carried out by etching using a fluorine-containing gas.

Figure 5:
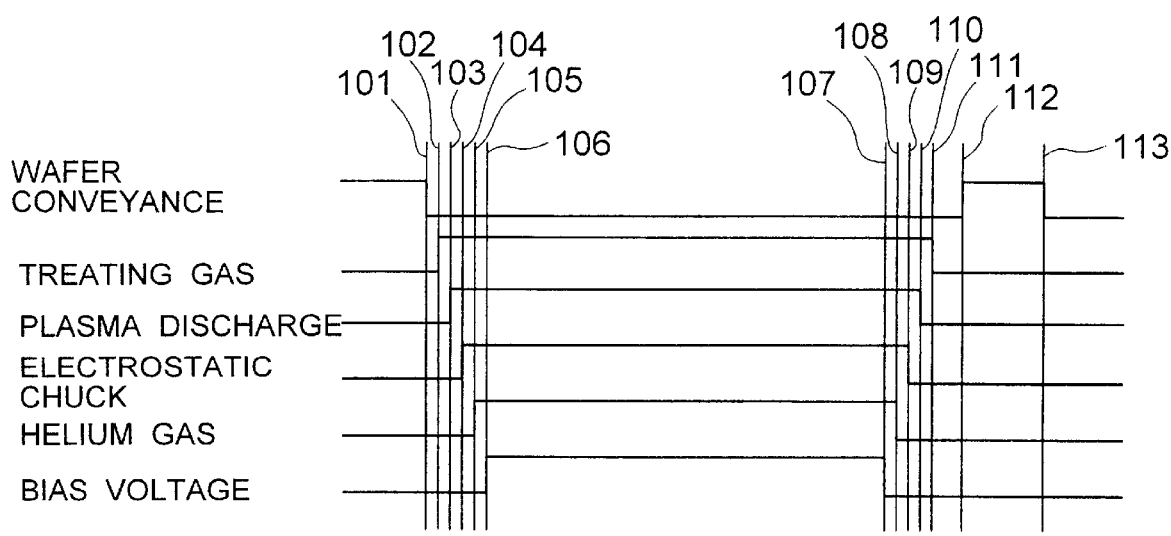
FIG. 5 is a chart illustrating effects obtained by the use of a plasma treatment apparatus according to the first embodiment.
Figure 6:
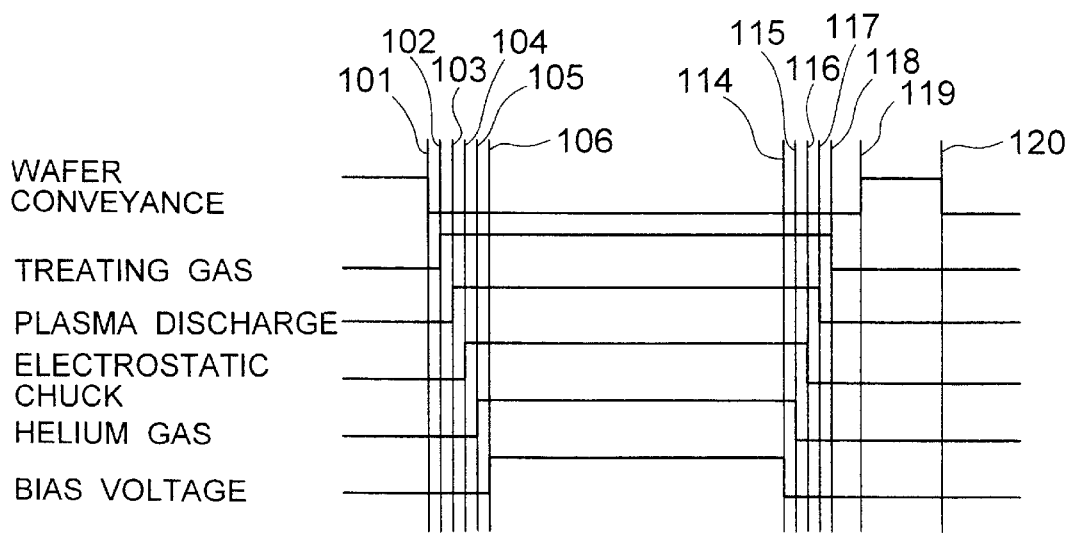
FIG. 6 is a chart illustrating the effects obtained by the use of the plasma treatment apparatus according to the first embodiment.

FIG. 5 and FIG. 6 are diagrams illustrating effects obtained by the use of the plasma treatment apparatus according to the present embodiment. FIG. 5 is a time chart of treatment in a conventional treatment apparatus, and FIG. 6 is a time chart of treatment in the treatment apparatus according to the present embodiment.

In FIG. 5, a wafer is set at first on the wafer stage by the use of a conveying system equipped with the treatment apparatus (101). Next, a treatment chamber is evacuated for 5 seconds and then the pressure inside the treatment chamber is controlled at a definite pressure by introducing a treating gas thereinto (102). After the pressure inside the treatment chamber reached a set value about 3 seconds after the start of the gas introduction, plasma discharge is initiated (103). After 0.5 second, a direct-current voltage for an electrostatic chuck is applied to attract the wafer (104). After another 1 second, helium gas is allowed to get under the reverse side of the wafer and its flow rate is controlled with a flow rate controller so that the pressure of helium may become a set value (105). After about 1 second, the pressure of helium reached the set value, and then a bias electric power is input to the wafer stage (106).

In this case, the temperature of the wafer stage is 0° C. and the bias electric power is 1 kW. Since the etching rate attained under these conditions is 400 nm/min, the treatment time (the etching time) is 5 minutes. After completion of the etching, the application of the bias electric power is stopped (107). After 0.5 second, the helium gas is exhausted (108). After another 0.5 second, the exhaustion of the helium gas is completed, and hence the voltage application to the electrostatic chuck is stopped (109). The electric charge generated in the wafer is released into the plasma by exposing the wafer to the plasma for 2 seconds.

Since the attracting force for the wafer is lost owing to the above operations, the wafer becomes conveyable and the plasma discharge is stopped (110). After 0.5 second, the introduction of the treating gas is stopped and the treatment chamber is evacuated (111). After 2 seconds, the pressure inside the treatment chamber reached a definite pressure or lower, and then carrying-out of the treated wafer and carrying-in of a wafer to be treated are initiated (112). Numeral 113 indicates a point of time at which the carrying-out of the new wafer has been completed, and the total time required for the carrying-in and the carrying-out is 30 seconds. In the above example of the treatment, a time required per wafer is a period from numeral 101 to numeral 113 and is 5 minutes 46 seconds in total.

FIG. 6 is a time chart of treatment in the plasma treatment apparatus according to the present embodiment as described above. In the case of the wafer stage according to the present embodiment, the temperature distribution of a wafer set on the wafer stage can be improved and moreover, a stress generated in the dielectric film on the wafer stage can be reduced. Therefore, a bias electric power input to the wafer stage can be increased to 2 kW from a conventional input of 1 kW. Consequently, the etching rate can be increased to 600 nm/min from a conventional rate of 400 nm/min. That is, a period of the application of the bias electric power (a period from numeral 106 to numeral 114) can be reduced to 3 minutes 20 seconds from a conventional period of 5 minutes. A time required for the operations other than the application of the bias electric power is the same as that conventionally required. Therefore, in the case shown in FIG. 6, a time required per wafer is reduced to 4 minutes and 6 seconds from a conventional time of 5 minutes and 46 seconds. That is, in the treatment apparatus according to the present embodiment, the wafer temperature distribution can be kept uniform and the generation of a stress in the dielectric film can be suppressed, even at a high heat input. Therefore, the throughput capacity of the apparatus can be greatly improved.

Figure 7:
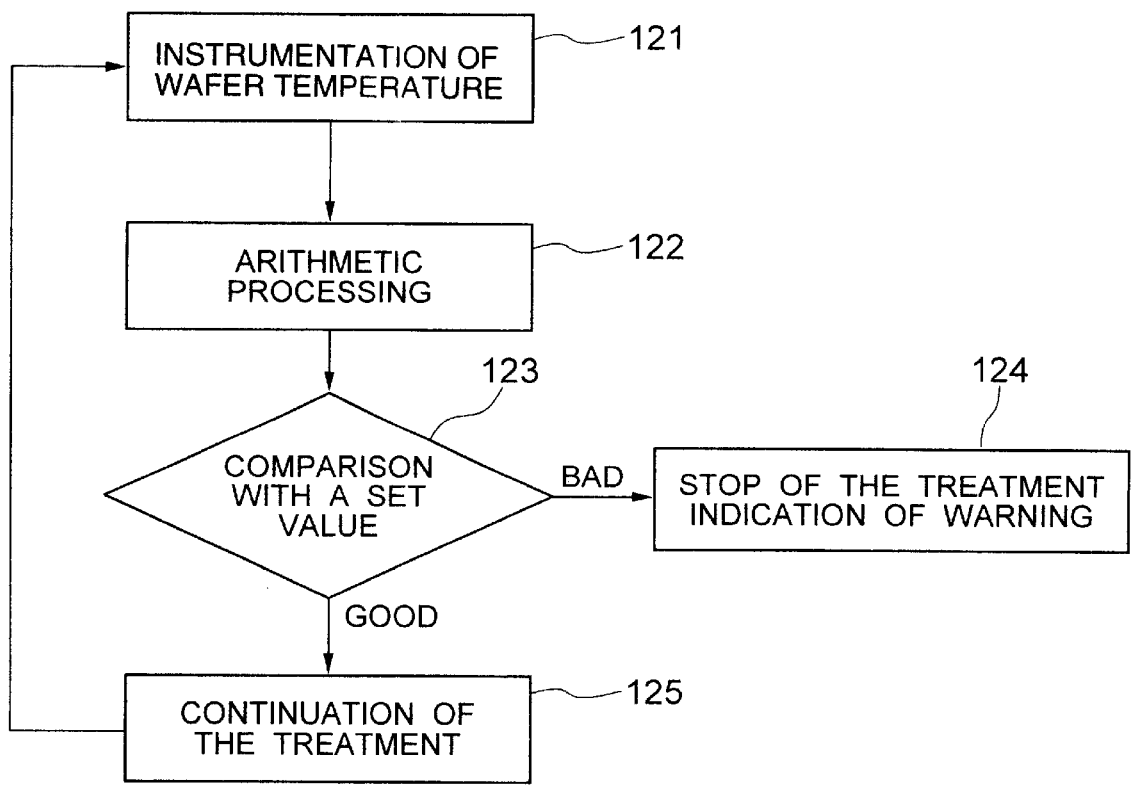
FIG. 7 is a chart showing a second embodiment.

FIG. 7 is a chart showing a second embodiment of the present invention. In this embodiment, the temperature of a wafer is directly measured from the reverse side of the wafer, and etching is controlled on the basis of the temperature information obtained. The temperature of the wafer may be measured with, for example, a fluoro-thermometer or a thermocouple. By such a means, the temperature of the wafer is measured at first (121). Then, the measurement data are sent to an external computer connected, to be subjected to arithmetic processing, whereby the temperature of the wafer is calculated (122). The temperature data obtained are compared with a previously set temperature range (123). When it was found as a result of the comparison that the temperature of the wafer is in a normal range, the treatment is continued (125). If the temperature of the wafer is not in the normal range, the treatment is stopped and the detection of an abnormality is indicated in a place convenient for recognition by an operator, such as the display of the computer (124).

In the above treatment method, since quick measures can be adopted when an abnormality occurs in the treatment, the production of a large number of defective wafers is prevented, namely, the manufacturing cost can be kept low.

Although the temperature of the wafer is directly measured in the present embodiment, the direct measurement of the wafer temperature is not always necessary. The temperature of the wafer under treatment can be predicted, for example, by monitoring the temperature at any position of the wafer stage, for instance, the temperature of the refrigerant, and using the previously determined relationship between the refrigerant temperature and the wafer temperature.

Figure 8:
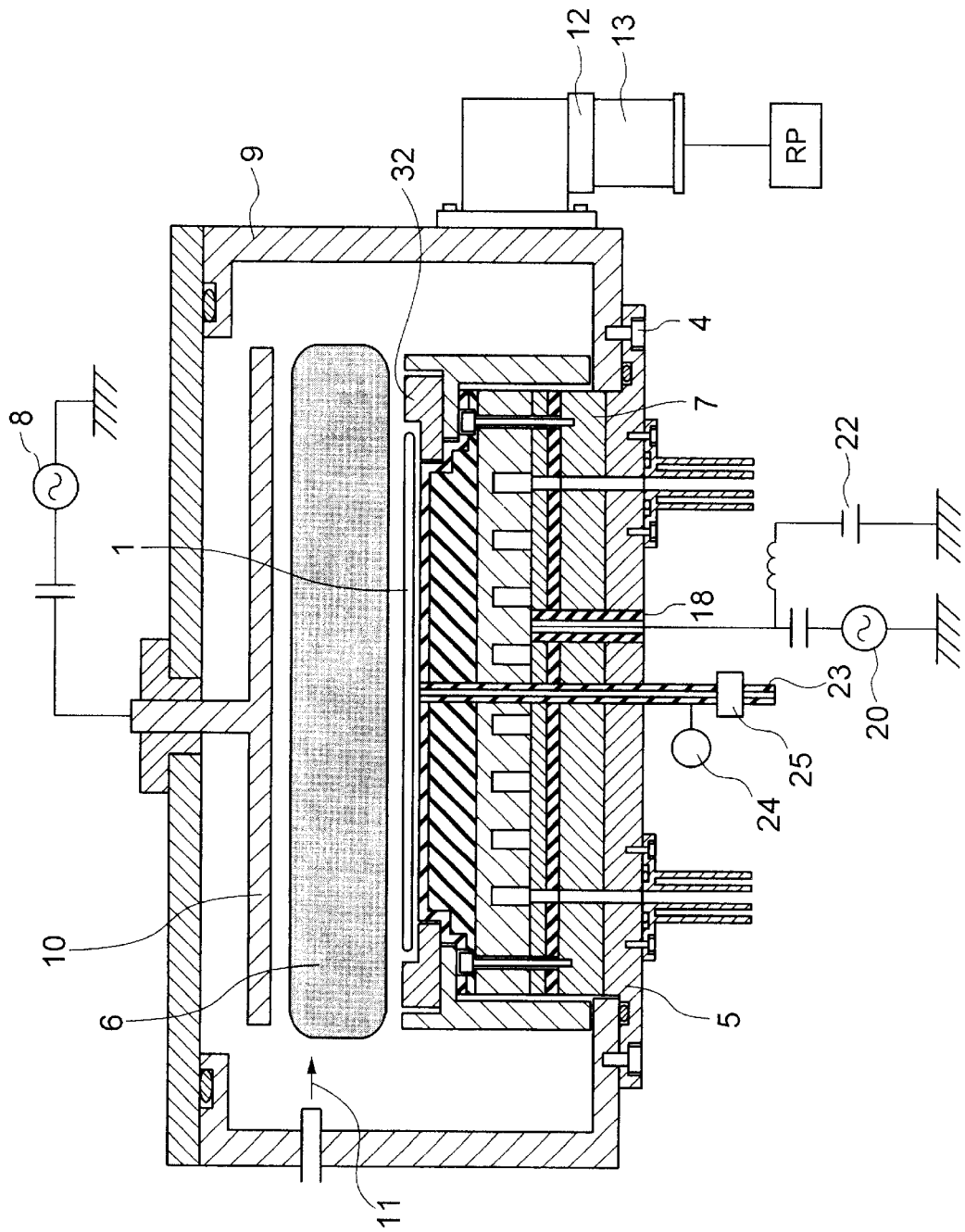
FIG. 8 is a diagram showing a third embodiment.
Figure 9:
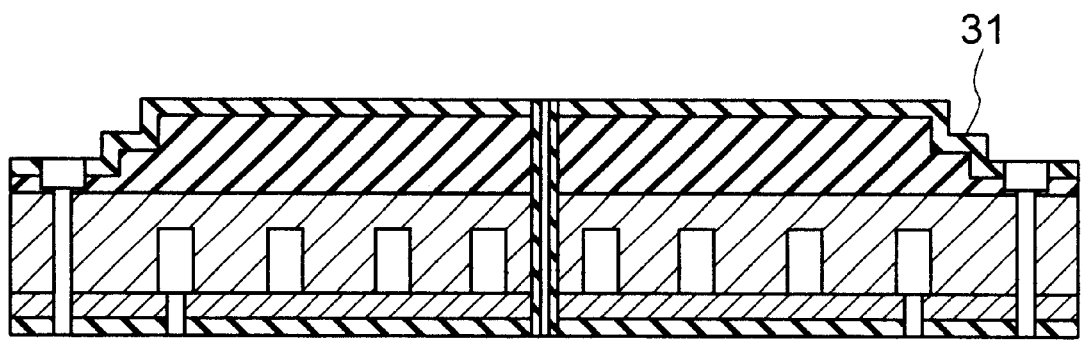
FIG. 9 is a diagram showing the third embodiment.

FIG. 8 and FIG. 9 are diagrams showing a third embodiment of the present invention. FIG. 8 is a diagram showing a wafer processing apparatus equipped with a wafer stage, and FIG. 9 is an enlarged view of the wafer stage portion. In FIG. 9, numeral 31 denotes a staircase-like level difference portion formed in a stress-reducing member. Said level difference portion has a diameter smaller than the outside diameter of a semiconductor wafer to be set thereon. In FIG. 8 and FIG. 9, explanation of the same parts as shown in FIG. 12 and FIG. 13 is omitted by expressing these parts by the same symbols, respectively, as in FIG. 12 and FIG. 13. When the wafer stage is used in the processing apparatus, a silicon ring 32 (called, for example, a focus ring) is mounted on a dielectric film around the periphery of the level difference portion. In such a situation, plasma is produced in a processing chamber in the same manner as in the case shown in FIG. 1, and a direct-current voltage is applied to the wafer stage, whereby the ring is electrostatically attracted like the wafer. When a bias electric power is input to the wafer stage thus treated, a bias potential is generated also in the ring, so that accelerated ions penetrate also into the ring from the aforesaid plasma.

According to the present embodiment, the excess fluorine radicals in the plasma can be removed by the use of the aforesaid ring to realize a plasma distribution which is uniform from the center of the wafer to its periphery. Therefore, etching characteristics on the wafer surface can be made uniform. That is, the present embodiment is advantageous when an insulating film is etched with a fluorine-containing plasma.

Furthermore, according to the present embodiment, more uniform etching characteristics can be attained because the focus ring can be cooled while assuring the uniformity of the wafer temperature. As a material for the aforesaid ring 32, carbon, SiC and the like can be utilized besides silicon.

Figure 10:
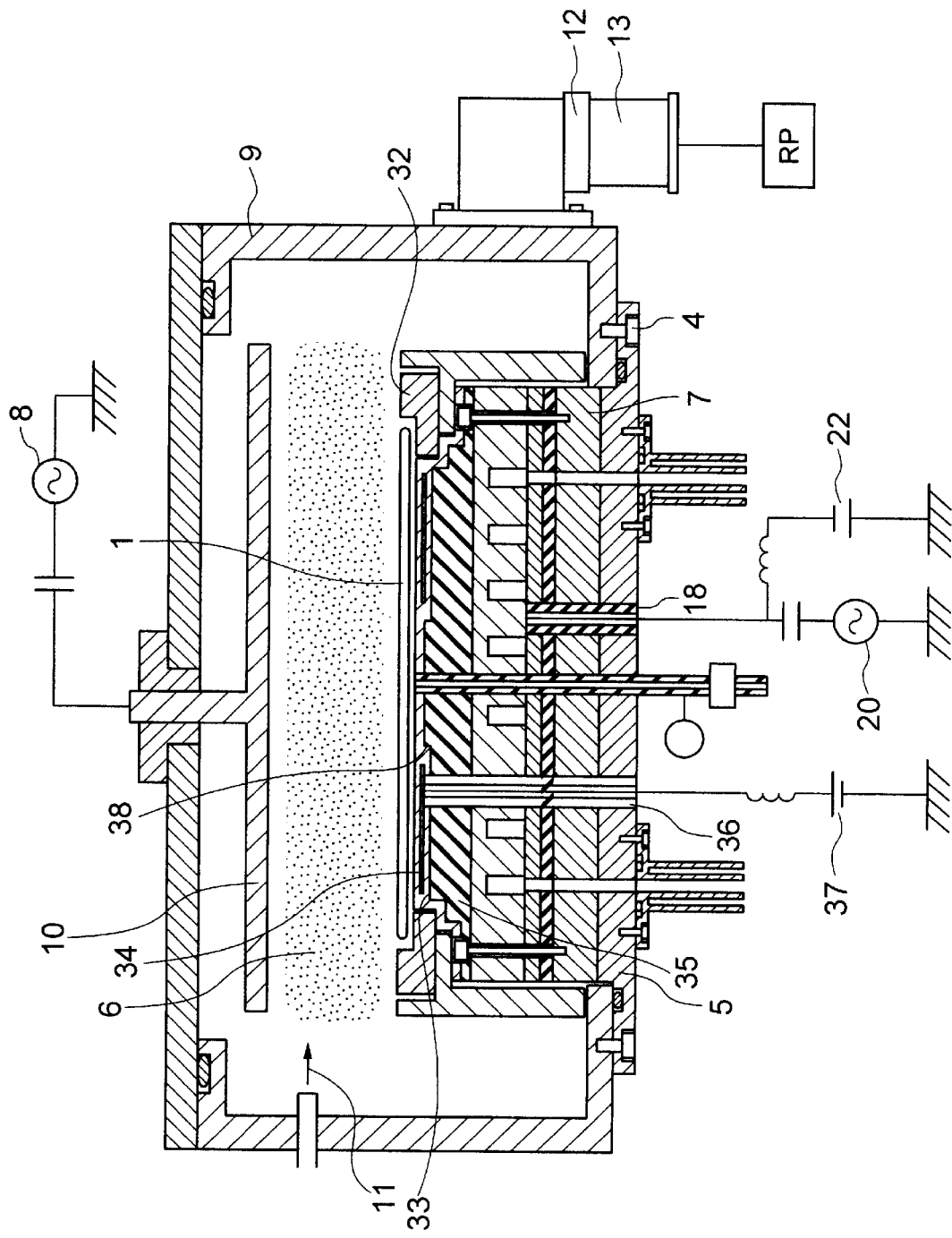
FIG. 10 is a diagram showing a fourth embodiment.
Figure 11:
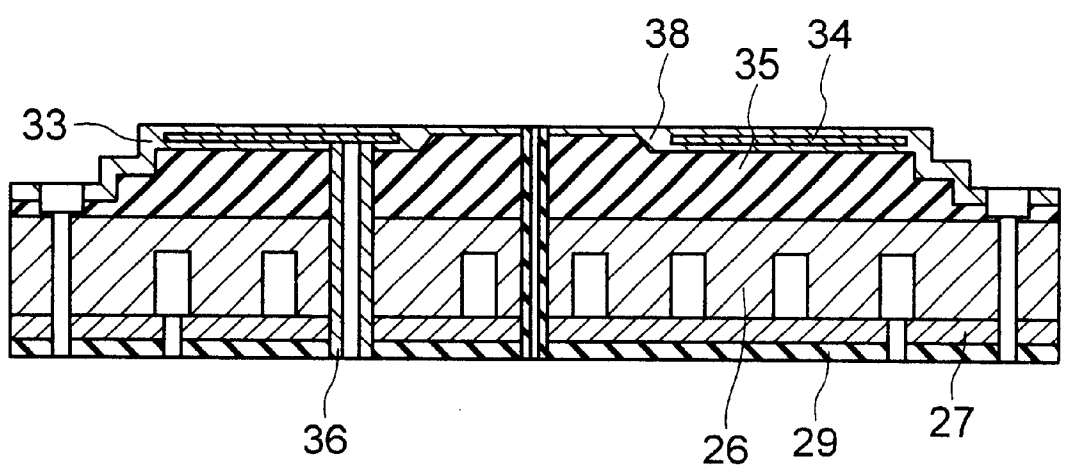
FIG. 11 is a diagram showing the fourth embodiment.

FIG. 10 and FIG. 11 are diagrams showing a fourth embodiment of the present invention. FIG. 10 is a diagram showing a wafer processing apparatus equipped with a wafer stage. FIG. 11 is an enlarged view of the wafer stage portion. As shown in FIG. 10 and FIG. 11, a level difference portion 38 is formed in the peripheral portion of a stress-reducing member 35 so that the level difference portion may be lower in its peripheral portion than in the vicinity of the center. An insulating layer (for example, a dielectric film 33) for electrical insulation from the stress-relaxing member is formed at the periphery of the aforesaid level difference portion 38. Ring-shaped tungsten internal electrodes 34 are formed on the insulating layer. In addition, a dielectric film 33 for attracting a wafer is further attached onto the insulating layer by flame spraying. The internal electrodes 34 are connected to an external direct-current power source 37 through an insulating material 36. The polarity of the direct-current power source 37 is reverse to that of the direct-current power source 22. When such a structure is employed, an electric circuit can be formed through the wafer irrespective of the presence of plasma 6, so that the wafer can be attracted. In FIG. 10 and FIG. 11, explanation of the same parts as shown in FIG. 12 and FIG. 13 is omitted by expressing these parts by the same symbols, respectively, as in FIG. 12 and FIG. 13.

According to the present embodiment, the attraction of the wafer and the introduction of helium gas can be carried out before the initiation of plasma discharge. Therefore, the control of the wafer temperature can be initiated immediately after the start of processing of the wafer. Moreover, since the wafer can be set or removed irrespective of the presence of plasma, a waiting period for eliminating the electric charge of the wafer after completion of the processing is unnecessary, so that the throughput is increased.

The dielectric film 33 can be formed by not only flame spraying but also brazing of a sintered product or attachment of the dielectric film with an adhesive. Although the internal electrodes are formed as rings, their shape may be another shape. That is, the wafer can be attracted by supplying different potentials to a plurality of the internal electrodes, respectively, facing the wafer.

As described above, according to the present embodiment, there can be provided a wafer stage on which the temperature distribution of a wafer is uniform even at a high heat input. In addition, since a film stress generated in the dielectric film formed on the surface of the wafer stage can be kept low even at a high temperature, the wafer stage can be provided as a highly reliable one. When the wafer stage is used, the wafer can be maintained at a uniform temperature without breakage of the dielectric film of the wafer stage even at a high heat input to the wafer stage. Therefore, a processing apparatus having a high throughput capacity can be provided.

When the temperature of the wafer is abnormal, the processing is immediately stopped and the abnormality can be reported to an operator. Therefore, wasteful processing of the wafer can be minimized, so that the manufacturing cost can be reduced. Furthermore, since the plasma can be made uniform by virtue of the ring of silicon or the like located around the wafer, etching characteristics on the wafer surface can be kept good.

As explained above, according to the present invention, there can be provided a wafer stage which permits uniform and very accurate control of the temperature of a wafer as a substrate to be processed. By utilizing such a wafer stage, there can be provided a processing apparatus and a processing method, which have a high throughput capacity.

What is claimed is:

1. A wafer stage for holding a semiconductor wafer in a plasma treatment apparatus by setting the wafer on the wafer stage, said wafer stage comprising:
   a base material equipped with refrigerant flow paths for allowing a refrigerant for temperature adjustment to flow,
   a stress-reducing member provided on the wafer setting side of said base material and having a smaller thermal expansion coefficient than does said base material,
   a dielectric film provided on the wafer setting side of said stress-reducing member, and
   a deflection-preventing member provided on the wafer non-setting side of said base material and having a smaller thermal expansion coefficient than does said base material.

2. The wafer stage according to claim 1, wherein said dielectric film is a film formed by flame spraying and composed mainly of a ceramic.

3. The wafer stage according to claim 1, wherein said dielectric film is a film formed by chemical vapor deposition and composed mainly of a ceramic.

4. The wafer stage according to claim 1, wherein said dielectric film is a sintered product composed mainly of a ceramic.

5. The wafer stage according to claim 4, wherein the dielectric film comprising a sintered product composed mainly of a ceramic is brazed to said stress-reducing member or attached thereto with an adhesive.

6. A wafer stage for holding a semiconductor wafer in a plasma treatment apparatus by setting the wafer on the wafer stage, said wafer stage comprising:
   a base material equipped with refrigerant flow paths for allowing a refrigerant for temperature adjustment to flow,
   a stress-reducing member provided on the wafer setting side of said base material and having a smaller thermal expansion coefficient than does said base material,
   a dielectric film provided on the wafer setting side of said stress-reducing member, and
   a deflection-preventing member provided on the wafer non-setting side of said base material and having a smaller thermal expansion coefficient than does said base material, wherein said stress-reducing member has a cylindrical and internally convex level difference portion with a diameter smaller than the outside diameter of a semiconductor wafer to be set thereon, and a ring member made of carbon, Si or SiC is mounted on said dielectric film around the periphery of said level difference portion.

7. The wafer stage according to any one of claims 1 to 6, wherein said dielectric film is equipped with a plurality of electrodes for electrostatic attraction, and different potentials are supplied to the plurality of the electrodes, respectively.

8. A wafer stage comprising:
   a base material equipped with refrigerant flow paths for allowing a refrigerant for temperature adjustment to flow,
   a stress-reducing member brazed to the wafer setting side of said base material and having a smaller thermal expansion coefficient than does said base material,
   a dielectric film provided on the wafer setting side of said stress-relaxing member, and
   a deflection-preventing member brazed to the wafer non-setting side of said base material and having a smaller thermal expansion coefficient than does said base material.

* * * * *